(12) United States Patent
Mo et al.

(10) Patent No.: US 9,252,018 B2
(45) Date of Patent: Feb. 2, 2016

(54) HIGH-K/METAL GATE TRANSISTOR WITH L-SHAPED GATE ENCAPSULATION LAYER

(75) Inventors: Renee T. Mo, Briarcliff Manor, NY (US); Wesley C. Natzle, New Paltz, NY (US); Vijay Narayanan, New York, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/571,977

(22) Filed: Aug. 10, 2012

(65) Prior Publication Data

US 2012/0299122 A1    Nov. 29, 2012

Related U.S. Application Data

(62) Division of application No. 12/551,292, filed on Nov. 18, 2009.

(51) Int. Cl.
| | |
|---|---|
| *H01L 29/78* | (2006.01) |
| *H01L 21/28* | (2006.01) |
| *H01L 29/49* | (2006.01) |
| *H01L 29/51* | (2006.01) |
| *H01L 29/66* | (2006.01) |

(52) U.S. Cl.
CPC ...... *H01L 21/28088* (2013.01); *H01L 29/4966* (2013.01); *H01L 29/517* (2013.01); *H01L 29/6659* (2013.01); *H01L 29/7833* (2013.01)

(58) Field of Classification Search
CPC ............ H01L 29/6659; H01L 29/6656; H01L 29/7833; H01L 21/823468
USPC .......... 257/351, 369, 900, E21.624, E21.626, 257/E21.64
See application file for complete search history.

(56) References Cited

U.S. PATENT DOCUMENTS

| | | | | |
|---|---|---|---|---|
| 5,258,645 | A | 11/1993 | Sato | |
| 5,736,446 | A * | 4/1998 | Wu | ................................ 438/305 |
| 5,783,475 | A * | 7/1998 | Ramaswami | ................. 438/303 |

(Continued)

FOREIGN PATENT DOCUMENTS

WO    WO2009053327 A1    4/2009

OTHER PUBLICATIONS

International Search Report and Written Opinion, dated Mar. 25, 2011 for PCT/EP2010/062109.

(Continued)

*Primary Examiner* — David Vu
(74) *Attorney, Agent, or Firm* — Fleit Gibbons Gutman Bongini & Bianco PL; Thomas Grzesik

(57) ABSTRACT

A transistor is provided that includes a silicon layer with a source region and a drain region, a gate stack disposed on the silicon layer between the source region and the drain region, an L shaped gate encapsulation layer disposed on sidewalls of the gate stack, and a spacer disposed above the horizontal portion of the gate encapsulation layer and adjacent to the vertical portion of the gate encapsulation layer. The gate stack has a first layer of high dielectric constant material, a second layer comprising a metal or metal alloy, and a third layer comprising silicon or polysilicon. The gate encapsulation layer has a vertical portion covering the sidewalls of the first, second, and third layers of the gate stack and a horizontal portion covering a portion of the silicon layer that is adjacent to the gate stack.

20 Claims, 3 Drawing Sheets

(56) References Cited

U.S. PATENT DOCUMENTS

| | | | |
|---|---|---|---|
| 6,004,852 A | 12/1999 | Yeh et al. | 438/303 |
| 6,030,876 A * | 2/2000 | Koike | 438/303 |
| 6,300,208 B1 * | 10/2001 | Talwar et al. | 438/308 |
| 6,323,519 B1 | 11/2001 | Gardner et al. | |
| 6,469,350 B1 * | 10/2002 | Clark et al. | 257/349 |
| 6,693,013 B2 * | 2/2004 | Bae et al. | 438/303 |
| 7,229,869 B2 | 6/2007 | Yoon et al. | |
| 7,495,280 B2 * | 2/2009 | Lo | 257/314 |
| 7,495,290 B2 | 2/2009 | Li | |
| 7,554,833 B2 | 6/2009 | Hashimoto | |
| 8,004,044 B2 * | 8/2011 | Ogawa et al. | 257/369 |
| 8,034,678 B2 | 10/2011 | Kobayashi | |
| 2004/0033678 A1 | 2/2004 | Arghavani et al. | |
| 2006/0154425 A1 * | 7/2006 | Yang et al. | 438/287 |
| 2006/0157750 A1 | 7/2006 | Kim et al. | |
| 2008/0014730 A1 | 1/2008 | Arghavani et al. | |
| 2008/0017936 A1 | 1/2008 | Buchanan et al. | |
| 2008/0258227 A1 | 10/2008 | Wang et al. | |
| 2011/0049567 A1 * | 3/2011 | Peng et al. | 257/190 |

OTHER PUBLICATIONS

Office Action dated Jun. 14, 2011 for U.S. Appl. No. 12/551,292.
Final Office Action dated Jan. 9, 2012 for U.S. Appl. No. 12/551,292.
Office Action dated Apr. 16, 2014 for U.S. Appl. No. 12/551,292.
Final Rejection dated Aug. 6, 2014 received for U.S. Appl. No. 12/551,292.
Non-Final Rejection dated Feb. 17, 2015 received for U.S. Appl. No. 12/551,292.
Final Office Action dated Jun. 12, 2015, received for U.S. Appl. No. 12/551,292.

* cited by examiner

HIGH-K/METAL GATE TRANSISTOR WITH L-SHAPED GATE ENCAPSULATION LAYER

CROSS REFERENCE TO RELATED APPLICATIONS

This application is a divisional of prior U.S. application Ser. No. 12/551,292, filed Nov. 18, 2009. The entire disclosure of U.S. application Ser. No. 12/551,292 is herein incorporated by reference.

FIELD OF THE INVENTION

The present invention generally relates to the field of semiconductors, and more particularly relates to high-κ dielectric and metal gate transistors.

BACKGROUND OF THE INVENTION

High dielectric constant (high-κ) transistors in conjunction with metal gates, or "MHK transistors", are undergoing active development in the industry. In an MHK transistor, any extrinsic oxygen that enters the formed high-k gate layer during subsequent processing changes the electrical properties of the MHK transistor. One of the more deleterious impacts of extrinsic oxygen is the lower κ interfacial oxide (SiOx) regrowth underneath the high-κ layer. It is critical to prevent such dielectric regrowth in order to achieve the desired dielectric thickness and maintain good short channel control. A conventional MHK transistor, such as the one disclosed in U.S. Patent Application Publication No. 2004/033678, uses an I-shaped gate encapsulation layer to protect the high-k gate layer from such dielectric regrowth. While this protects the high-k gate layer, one observed problem with such a transistor is that an I-shaped gate encapsulation layer often leads to the high-k/metal gate layer being exposed, so as to leave it open to attack during subsequent wet etching with the possibility of extrinsic oxygen ingress.

When the metal high-k gate stack is not perfectly vertical but instead has a sloped profile, the I-shaped gate encapsulation layer does not sufficiently protect the metal layer of the gate stack. This leaves the metal gate layer exposed and open to oxygen ingress and attack during subsequent wet etches In particular, the edge of the metal gate layer is exposed so that metal is etched out. As a result of the gate being undercut, the electrical properties of the metal high-k transistor are changed. Further, in many cases the gate is undercut to such an extent that the gate stack lifts off and is then re-deposited elsewhere on the integrated circuit wafer. Thus, the use of an I-shaped gate encapsulation layer to protect the gate stack results in poor yield and a process that is not robust.

SUMMARY OF THE INVENTION

One embodiment of the present invention provides a transistor that includes a silicon layer with a source region and a drain region, a gate stack disposed on the silicon layer between the source region and the drain region, an L shaped gate encapsulation layer disposed on sidewalls of the gate stack, and a spacer disposed above the horizontal portion of the gate encapsulation layer and adjacent to the vertical portion of the gate encapsulation layer. The gate stack has a first layer of high dielectric constant material, a second layer comprising a metal or metal alloy, and a third layer comprising silicon or polysilicon. The gate encapsulation layer has a vertical portion covering the sidewalls of the first, second, and third layers of the gate stack and a horizontal portion covering a portion of the silicon layer that is adjacent to the gate stack.

Another embodiment of the present invention provides a method for fabricating a transistor. According to the method, a first layer is formed on a silicon layer, with the first layer being a high dielectric constant material. A second layer is formed on the first layer, with the second layer being a metal or metal alloy. A third layer is formed on the second layer, with the third layer being silicon or polysilicon. The first, second, and third layers are etched so as to form first, second, and third layers of a gate stack, and an encapsulation layer is deposited. A spacer is deposited above the horizontal portion of the gate encapsulation layer and adjacent to the vertical portion of the gate encapsulation layer; and the spacer is etched so as to form an L shaped gate encapsulation layer disposed on sidewalls of the gate stack. The gate encapsulation layer has a vertical portion covering the sidewalls of the first, second, and third layers of the gate stack and a horizontal portion covering a portion of the silicon layer that is adjacent to the gate stack.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION

FIGS. 1 to 5 illustrate a process for fabricating a metal high-k transistor with an L-shaped gate encapsulation layer according to one embodiment of the present invention. In these figures an NFET transistor and a PFET transistor are shown arranged in a side-by-side manner for convenience of description. However, this is not meant to limit the present invention. Embodiments of the present invention can be directed to one or more NFET transistors, one or more PFET transistors, or a combination of these two types of transistors.

Figure 1:
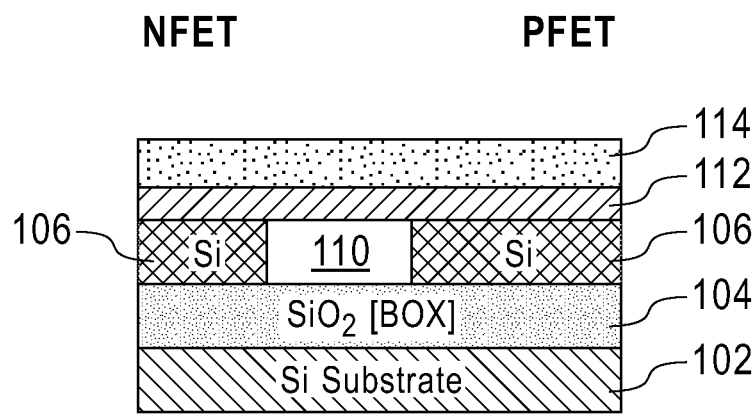
FIGS. 1 to 5 are cross-sectional views of a process for fabricating a metal high-k transistor with an L-shaped gate encapsulation layer according to one embodiment of the present invention.

The process of this embodiment begins with a silicon-on-insulator (SOI) wafer that has a silicon substrate 102, an overlying oxide layer ("BOX") 104 (e.g., of 3 μm), and an overlying silicon layer 106. One or more STI regions 110 are formed in the silicon layer 106. There is deposited a metal oxide or metal oxynitride dielectric layer whose dielectric constant (k) is greater than 3.9 to form a high-k dielectric layer 112 for the gate stack, as shown in FIG. 1. Exemplary materials for this high-k dielectric layer 112 are $HfO_2$, HfSiO, HfSiON, HfZrO, $TiO_2$, $La_2O_3$, $Y_2O_3$, $Al_2O_3$, and mixtures thereof. Preferably, the dielectric constant (k) of the high-k dielectric layer is between 18 and 40. In one embodiment, a hafnium dioxide ($HfO_2$) layer with a k value in the range of about 20-25 (as compared to 3.9 for $SiO_2$) is deposited with an exemplary thickness in the range of about 1-3 nm.

A metal layer is then deposited to form a metal layer 114 for the gate stack. Preferably, the metal layer 114 is formed of a thermally stable metal, such as TiN, TaN, TaC, TiAlN, TaAlN, or their derivatives. In one embodiment, a titanium nitride layer (TiN) is deposited with an exemplary thickness of about 1-10 nm, and preferably about 2-5 nm. The high-k dielectric layer 112 and metal layer 114 together form the (as yet unpatterned) MHK gate stack. This initial structure represents a conventional SOI CMOS with an MHK gate stack. In an alternative embodiment, a bulk silicon wafer is used in place of the SOI wafer.

Figure 2:
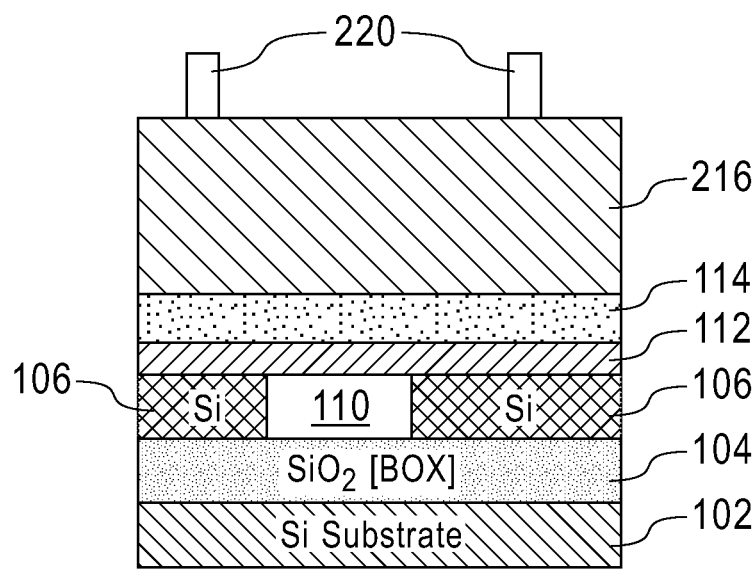

FIG. 2 shows the structure after the deposition of an amorphous silicon (or polysilicon) layer 216 having an exemplary thickness in the range of about 20-100 nm, and the subsequent deposition and patterning of a photoresist layer 220. The photoresist 220 is left where a device gate stack is desired to be formed. In alternative embodiments, layer 216 is formed of a conducting metal such as tungsten or aluminum.

Figure 3:
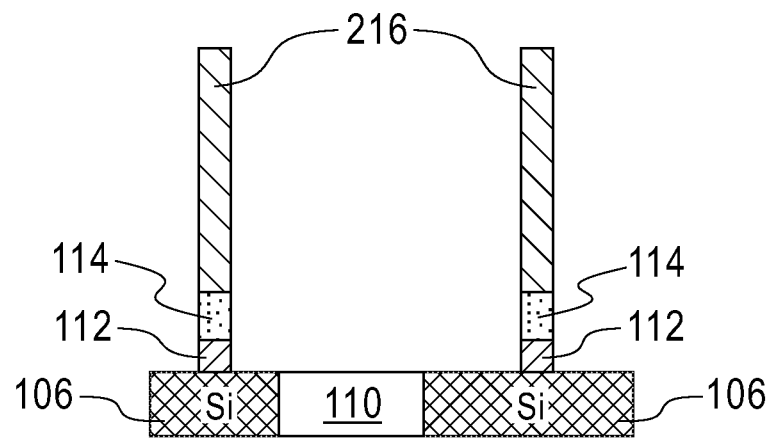

FIG. 3, which is a partial view that does not include the silicon substrate 102 and oxide layer 104 for simplicity, shows the result after a gate stack etch and subsequent removal of the photoresist 220. In this embodiment, the gate stack etch is performed in one step: a single etch that stops on the silicon layer 106. In an alternative embodiment, the gate stack is etched in two steps: a first etch of the metal layer 114 that stops at the high-k layer 112, and a second etch of the high-k layer 112 that stops at the silicon layer 106.

The resulting gate stack is formed by the high-k layer 112, the metal layer 114, and the silicon layer 216. In the gate stack of this embodiment, a lateral extent (width) of the high-k layer 112 is the same as a lateral extent (width) of the metal and silicon layers 114 and 216.

Figure 4:
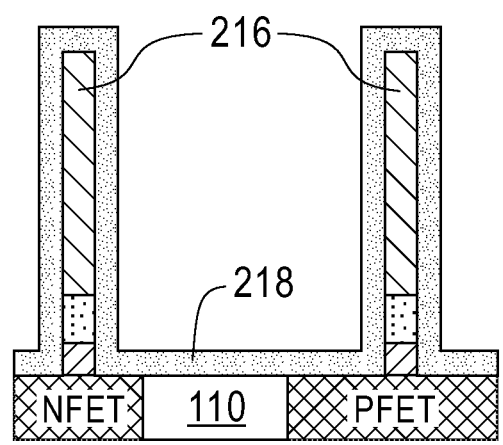

After the gate stack etch, nitride (e.g., SiN) is deposited to form a nitride layer 218, as shown in FIG. 4. This deposition is performed using a conformal deposition process so that the vertical portion of the nitride layer located on the side of the gate stack is substantially the same thickness as the horizontal portion of the nitride layer located on top of the silicon layer 106. Preferably, the nitride layer 218 is deposited using an extremely conformal deposition process so that the vertical portion of the nitride layer is the same thickness as the horizontal portion of the nitride layer. Exemplary deposition processes used in embodiments of the present invention include molecular layer deposition (MLD), atomic layer deposition (ALD), low-pressure chemical vapor deposition (LPCVD), and rapid thermal chemical vapor deposition (RTCVD).

Thus, the nitride layer 218 covers the exposed surfaces of the high-k layer 112, the metal layer 114, and the silicon layer 216 of the gate stack, and the silicon layer 106. In this embodiment, the nitride layer 218 is formed with an exemplary thickness in the range of about 10-20 nm. In another embodiment, the nitride layer 218 has an exemplary thickness of about 6-15 nm.

Figure 5:
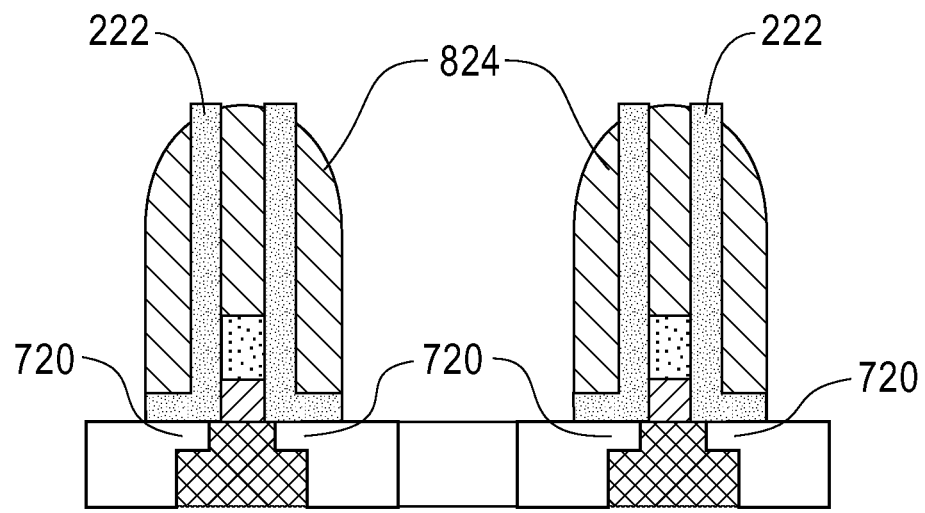

In one embodiment, oxide films are deposited (for example, by PECVD) and spacers 824 are then formed by reactive ion etching (RIE) so as to be above the horizontal portion of the gate encapsulation layer 218 and adjacent to the vertical portion of the gate encapsulation layer 218. In other words, each oxide spacer 824 extends from the vertical portion of its corresponding gate encapsulation layer 218 to the end of the horizontal portion of that gate encapsulation layer 218. The oxide spacers 824 of this embodiment have an exemplary thickness of about 2-10 nm. The RIE process for forming oxide spacers is used to form an L-shaped gate encapsulation layer 222, as shown in FIG. 5. The L-shaped gate encapsulation layer 222 has a vertical portion that remains on the sidewalls of the gate stack and a horizontal portion that remains on portions of the silicon layer 106 that are adjacent to the gate stack. This nitride gate encapsulation layer acts as an oxygen diffusion barrier and protects the metal gate layer from etching during subsequent processing.

The remainder of the fabrication process is a conventional CMOS fabrication process. In particular, extension implants 720 are alternately performed on the NFET and PFET transistors. In particular, photolithography is used to selectively define the areas for the source/drain extension implants for the NFET and PFET, and ions are implanted. The extension implant is performed using an n-type species for the NFET, and using a p-type species for the PFET.

The final spacer for the source/drain implant can be formed of an oxide or a nitride. The source/drain implant is performed using a p-type species for the NFET (for example, As or P), and using an n-type species for the PFET (for example, B or $BF_2$). A subsequent rapid thermal anneal (RTA) is performed (e.g., millisecond laser anneal or flash anneal) to provide relatively deep diffusions for the source and drain regions. Subsequent conventional processing is used to silicide the gates, sources, and drains (typically with Ni or Co) to complete the NFET and PFET transistors.

Figure 6:
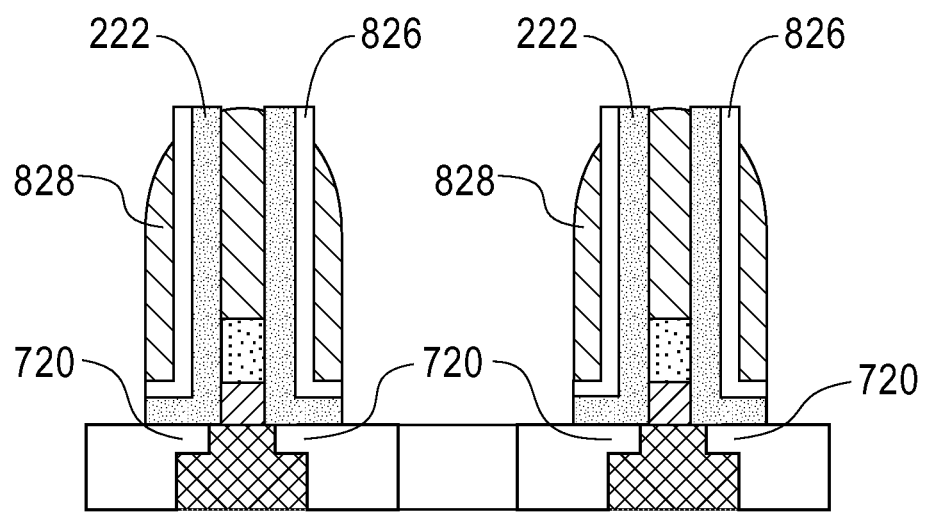
FIG. 6 is a cross-sectional view of a metal high-k transistor with an L-shaped gate encapsulation layer in accordance with another embodiment of the present invention.

FIG. 6 shows a metal high-k transistor with an L-shaped gate encapsulation layer in accordance with another embodiment of the present invention. In this embodiment, nitride spacers are used in place of the oxide spacers following formation of the gate encapsulation layer. More specifically, after the deposition of the nitride layer 218, an oxide (e.g., $SiO_2$) is deposited (for example, by PECVD) to form an oxide layer 826. In this embodiment, the nitride layer 218 is formed with an exemplary thickness in the range of about 5-20 nm. Nitride films are deposited (for example, by PECVD) and spacers 828 are then formed by RIE so as to be above the horizontal portion of the oxide layer 826 and adjacent to the vertical portion of the oxide layer 826. The nitride spacers 824 of this embodiment have an exemplary thickness of about 2-10 nm. Thus, in this embodiment, the L-shaped gate encapsulation layer 222 has a vertical portion that remains on the sidewalls of the gate stack and a horizontal portion that remains portions of the silicon layer 106 that are adjacent to the gate stack. An oxide layer 826 is provided between the gate encapsulation layer 222 and the nitride spacer 828 and acts as an etch stop layer and enables L-shaped encapsulation. Each nitride spacer 828 extends from the vertical portion of the corresponding oxide layer 826 to the end of the horizontal portion of that oxide layer 826, which is also the end of the horizontal portion of the underlying gate encapsulation layer 222. The remainder of the fabrication process is the same as in the embodiment described above.

Accordingly, embodiments of the present invention provide a MHK transistor having an L-shaped gate encapsulation layer. The L-shaped gate encapsulation layer prevents extrinsic oxygen from entering the high-k gate layer. Additionally, the L-shaped gate encapsulation layer prevents the metal gate layer from being attacked during etching when the gate stack is not perfectly vertical. In particular, the horizontal portion of the L-shaped gate encapsulation layer ensures that the edge of the metal gate layer is covered during etching. As a result, the gate is not undercut when the gate stack has a sloped profile. Thus, the electrical properties of the metal high-k transistor are not changed, while the process is more robust and a higher yield is obtained.

The embodiments of the present invention described above are meant to be illustrative of the principles of the present invention. These MHK device fabrication processes are compatible with CMOS semiconductor fabrication methodology, and thus various modifications and adaptations can be made by one of ordinary skill in the art. All such modifications still fall within the scope of the present invention.

For example, further embodiments can use other compatible materials for the high-k layer, such as HfSiO, HfSiON, HfZrO, TiO$_2$, La$_2$O$_3$, Y$_2$O$_3$, Al$_2$O$_3$, and mixtures thereof. The metal-containing layer 114 could also be formed of another material, such as one or more of TiN, TaN, TaC, TiAlN, TaAlN, or their derivatives. Additionally, in further embodiments the silicon layer 216 described above can be comprised of another material that is able to be etched, remain conductive, and withstand high temperatures. Further, in some embodiments, a silicon germanium layer is deposited over silicon layer 106 for the PFET only. In one embodiment, this silicon germanium layer has a thickness of about 5-10 nm and is about 20%-40% germanium. Likewise, while the illustrated embodiment described above relates to transistors on an SOI wafer, the transistors and fabrication methods of the present invention are also applicable to bulk technologies. Also, the various layer thicknesses, material types, deposition techniques, and the like discussed above are not meant to be limiting.

Furthermore, some of the features of the examples of the present invention may be used to advantage without the corresponding use of other features. As such, the foregoing description should be considered as merely illustrative of the principles, teachings, examples and exemplary embodiments of the present invention, and not in limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

What is claimed is:

1. A transistor comprising:
   a silicon layer including a source region and a drain region;
   a gate stack disposed on the silicon layer between the source region and the drain region, the gate stack comprising a first layer of high dielectric constant material, a second layer comprising a metal or metal alloy, and a third layer comprising silicon or polysilicon;
   an L-shaped gate encapsulation layer disposed on sidewalls of the gate stack, the gate encapsulation layer comprising a vertical portion covering the sidewalls of the first, second, and third layers of the gate stack and a horizontal portion covering a portion of the silicon layer that is adjacent to the gate stack;
   an L-shaped spacer layer comprising a vertical portion covering sidewalls of the vertical portion of the L-shaped gate encapsulation layer, and a horizontal portion covering the horizontal portion of the L-shaped gate encapsulation layer, where the L-shaped er is formed with a thickness that is less than a thickness of the L-shaped gate encapsulation layer;
   a spacer disposed above and on the horizontal portion of the L-shaped spacer layer and adjacent to and in contact with the vertical portion of the L-shaped spacer layer, wherein the L-shaped gate encapsulation layer, the L-shaped spacer layer, and the spacer are formed with a combined width that is greater than a width of the gate stack; and
   source/drain extensions in the silicon layer, the source/drain extensions not underlying the first layer of the gate stack, the source/drain extensions underlying and extending beyond part but not all of the vertical portion of the gate encapsulation layer, and the source and drain regions not underlying the first layer of the gate stack.

2. The transistor of claim 1, wherein the gate encapsulation layer comprises nitride.

3. The transistor of claim 2, wherein the spacer consists of a single oxide nitride layer.

4. The transistor of claim 2, wherein the L-shaped spacer layer comprises an oxide material and the spacer comprises a nitride material.

5. The transistor of claim 2, wherein a thickness of the gate encapsulation layer is less than a thickness of the first layer of the gate stack.

6. The transistor of claim 2, wherein a thickness of the vertical portion of the gate encapsulation layer is substantially equal to a thickness of the horizontal portion of the gate encapsulation layer.

7. The transistor of claim 2,
   wherein the first layer of the gate stack comprises at least one of HfO$_2$, HfSiO, HfSiON, HfZrO, TiO$_2$, La$_2$O$_3$, Y$_2$O$_3$, and Al$_2$O$_3$, and
   the second layer of the gate stack comprises at least one of TiN, TaN, TaC, TiAlN, and TaAlN.

8. The transistor of claim 1, wherein a distance between the source/drain extensions is greater than a lateral extent of the first layer of the gate stack.

9. The transistor of claim 1,
   wherein
   each of the source/drain extensions underlies part but not all of the spacer.

10. The transistor of claim 9, wherein the source and drain regions underlie part but not all of the single layer of the spacer.

11. The transistor of claim 1, wherein the third layer of the gate stack consists of amorphous silicon.

12. The transistor of claim 11, further comprising a layer of silicon germanium located on the silicon layer.

13. The transistor of claim 1, further comprising a layer of silicon germanium located between the silicon layer and the first layer of the gate stack.

14. The transistor of claim 1, wherein the horizontal portion of the L-shaped gate encapsulation layer directly contacts the silicon layer.

15. A transistor comprising:
  a silicon layer including a source region and a drain region;
  a gate stack disposed on the silicon layer between the source region and the drain region, the gate stack comprising a first layer of high dielectric constant material, a second layer disposed on and in contact with the first layer, and a third layer disposed on and in contact with the second layer, the second layer comprising one or more of TaN, TaC, TiAlN, TaAlN, and the third layer comprising aluminum and being separate from the second layer;
  an L-shaped gate encapsulation layer disposed on sidewalls of the gate stack, the gate encapsulation layer comprising a vertical portion covering the sidewalls of the first, second, and third layers of the gate stack and a horizontal portion covering a portion of the silicon layer that is adjacent to the gate stack;
  an L-shaped spacer layer comprising a vertical portion covering sidewalls of the vertical portion of the L-shaped a horizontal portion covering the horizontal portion of the L-shaped encapsulation layer, where the L-shaped r layer is formed with a thickness that is less than a thickness of the L-shaped gate encapsulation layer; and
  a spacer disposed above and on the horizontal portion of the L-shaped spacer layer and adjacent to and in contact with the vertical portion of the L-shaped spacer layer, wherein the L-shaped gate encapsulation layer, the L-shaped spacer layer, and the spacer are formed with a combined width that is greater than a width of the gate stack.

16. The transistor of claim 15, wherein the third layer consists of aluminum.

17. The transistor of claim 15, further comprising a layer of silicon germanium located between the silicon layer and the first layer of the gate stack.

18. The transistor of claim 15, further comprising source/drain extensions in the silicon layer, the source/drain extensions not underlying the first layer of the gate stack, the source/drain extensions underlying part but not all of the vertical portion of the gate encapsulation layer, and the source and drain regions not underlying the first layer of the gate stack.

19. The transistor of claim 18, wherein a distance between the source/drain extensions is greater than a lateral extent of the first layer of the gate stack.

20. The transistor of claim 15,
  wherein
  the source and drain regions underlie part but not all of the spacer.

* * * * *